United States Patent
Wu et al.

(10) Patent No.: US 11,550,228 B2
(45) Date of Patent: Jan. 10, 2023

(54) SYSTEM AND APPARATUS FOR LITHOGRAPHY IN SEMICONDUCTOR FABRICATION

(71) Applicant: Taiwan Semiconductor Manufacturing Company, Ltd., Hsinchu (TW)

(72) Inventors: Cheng-Kuan Wu, Hsinchu (TW); Po-Chung Cheng, Zhongpu Township, Chiayi County (TW); Li-Jui Chen, Hsinchu (TW); Chih-Tsung Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 111 days.

(21) Appl. No.: 17/213,491

(22) Filed: Mar. 26, 2021

(65) Prior Publication Data

US 2021/0216015 A1    Jul. 15, 2021

Related U.S. Application Data

(62) Division of application No. 16/019,732, filed on Jun. 27, 2018, now Pat. No. 10,962,881.

(60) Provisional application No. 62/584,992, filed on Nov. 13, 2017.

(51) Int. Cl.
*G03F 7/20* (2006.01)
*G03F 7/38* (2006.01)

(52) U.S. Cl.
CPC ...... *G03F 7/70616* (2013.01); *G03F 7/70708* (2013.01); *G03F 7/70783* (2013.01); *G03F 7/2004* (2013.01); *G03F 7/38* (2013.01)

(58) Field of Classification Search
CPC ...... G03F 7/2004; G03F 7/38; G03F 7/70616; G03F 7/70783; G03F 7/70708
USPC .......................................................... 430/30
See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |

*Primary Examiner* — Christopher G Young
(74) *Attorney, Agent, or Firm* — McClure, Qualey & Rodack, LLP (57) ABSTRACT

A lithography apparatus is provided. The lithography apparatus includes a wafer stage configured to secure a semiconductor wafer and having a plurality of electrodes. The lithography apparatus also includes an exposure tool configured to perform an exposure process by projecting an extreme ultraviolet (EUV) light on the semiconductor wafer. The lithography apparatus further includes a controller configured to control power supplied to the electrodes to have a first adjusted voltage during the exposure process for a first group of exposure fields on the semiconductor wafer so as to secure the semiconductor wafer to the wafer stage. The first adjusted voltage is in a range from about 1.6 kV to about 3.2 kV.

20 Claims, 7 Drawing Sheets

SYSTEM AND APPARATUS FOR LITHOGRAPHY IN SEMICONDUCTOR FABRICATION

PRIORITY CLAIM AND CROSS-REFERENCE

This application is a divisional application of U.S. application Ser. No. 16/019,732, filed on Jun. 27, 2018, which claims the benefit of U.S. Provisional Application No. 62/584,992, filed on Nov. 13, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposing process forms a patterned photoresist layer for various patterning and doping processes, such as etching or ion implantation. In a typical lithography process, a photosensitive layer (resist) is applied to a surface of a semiconductor substrate, and an image of features defining parts of the semiconductor device is provided on the layer by exposing the layer to a pattern of radiation. As semiconductor processes evolve to provide for smaller critical dimensions, and devices reduce in size and increase in complexity including number of layers, a way of accurately patterning the features is in order to improve the quality, reliability, and yield of the devices.

Although numerous improvements to the methods of performing a lithography exposing process have been invented, they have not been entirely satisfactory in all respects. Consequently, it would be desirable to provide a solution to improve the lithographic system so as to increase the production yield of the semiconductor wafers.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Figure 1:
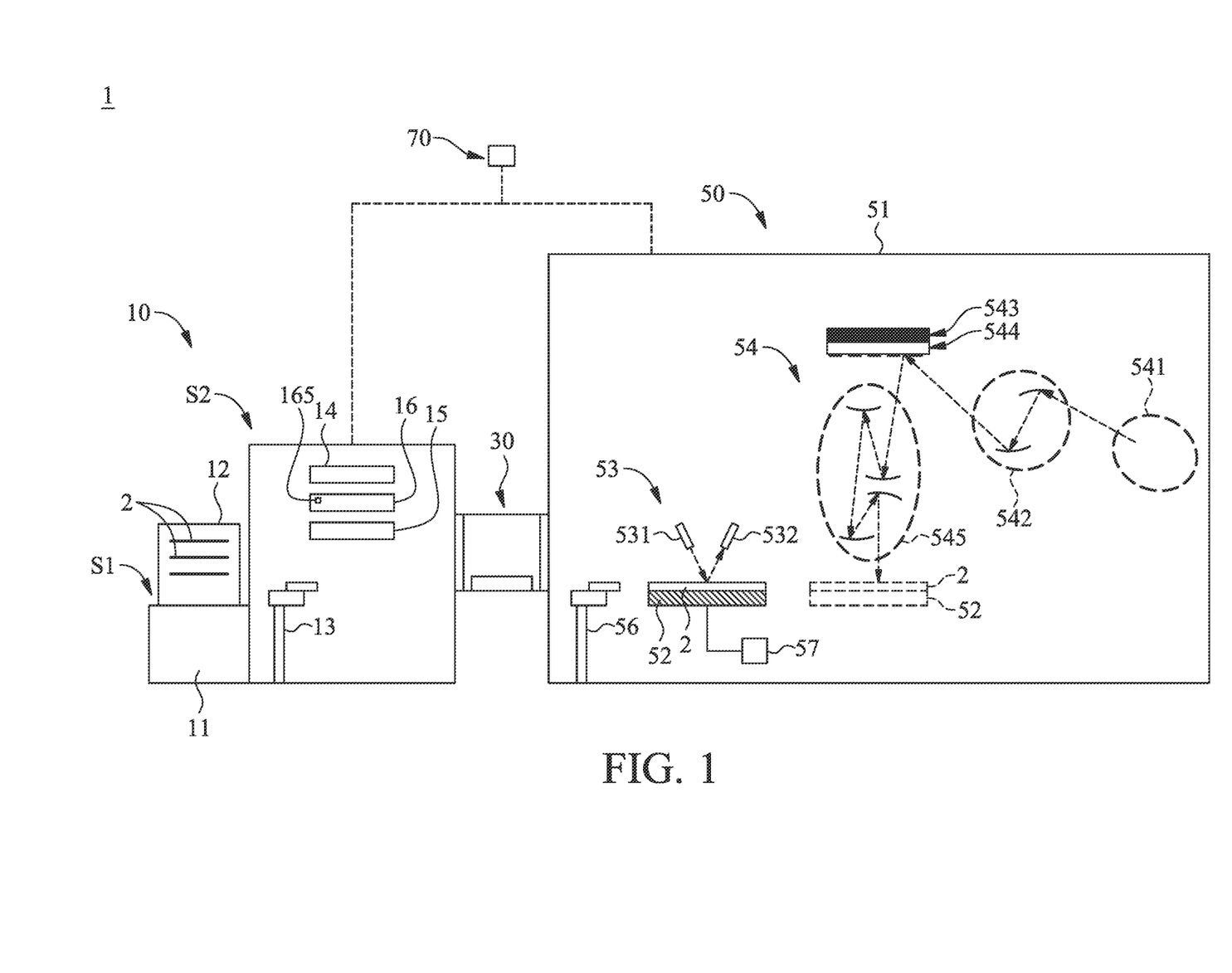
FIG. 1 shows a schematic and diagrammatic view of a lithographic system 1, in accordance with some embodiments.

FIG. 1 is a schematic and diagrammatic view of a lithographic system 1, in accordance with some embodiments. In some embodiments, the lithographic system 1 includes a track apparatus 10, a load lock chamber 30, an exposure apparatus 50, and a controlling apparatus 70. It is appreciated that the features described below can be replaced or eliminated in other embodiments of the lithographic system 1.

In some embodiments, the track apparatus 10 includes a cassette station S1 and a processing station S2 (performs substrate processes such as a photoresist coating process, a developing process) arranged in order. In some embodiments, the cassette station S1 includes a cassette stage 11 and a cassette 12. The cassette stage 11 is a holding portion that holds wafer cassettes (hereinafter referred to as cassettes) that are for example four substrate cassettes. Each cassette 12 contains a plurality of the semiconductor wafer 2. Each cassette 12 is placed on the cassette stage 11.

In some embodiments, the processing station S2 is located between the cassette station S1 and the load lock chamber 30. The processing station S2 transfers the semiconductor wafer 2 between the cassette station S1 and the load lock chamber 30.

In some embodiments, the processing station S2 is configured to carry out a photoresist coating process and a developing process, and the processing station S2 includes a transfer mechanism 13, a coating chamber 14, a developing chamber 15 and a thermal chamber 16. The transfer mechanism 13 is a transferring portion that transfers the semiconductor wafer 2 to and from the processing station S2. The transfer mechanism 13 may be elevated, moved leftward and rightward, moved forward and backward, and rotated around the vertical axis so as to transfer the semiconductor wafer 2 among the coating chamber 14, the developing chamber 15, and the thermal chamber 16.

The thermal chamber 16 is adapted to carry out a pre-treatment and/or post-treatment for the treatment to be performed in the developing chamber 15 and/or the coating chamber 14. For example, the thermal chamber 16 may include a heating unit (not shown in figures) adapted to heat each wafer 5 after subjected to the photoresist coating process. Alternatively, the thermal chamber 16 may include a post-exposure baking unit (PEB, not shown in figures) adapted to heat each wafer after subjected to a lithography exposing process. Alternatively, the thermal chamber 16 may include a post-baking unit (POST, not shown in figures) adapted to perform a heating process to vaporize moisture on each wafer 5 after the developing process.

In some embodiments, as shown in FIG. 1, one or more metrology tools 165 are positioned in the thermal chamber 16. In some embodiments, the metrology tool 165 includes a thermal couple adapted for measuring temperature of the semiconductor wafer 2 in the thermal chamber 16. In some other embodiments, the metrology tool 165 is configured to measure the topographic height of the semiconductor wafer 2 positioned in the thermal chamber 16. For example, the metrology tool 165 discharges gas onto a surface of the semiconductor wafer 2 via a nozzle (not shown in the figures) and detects a variation in the pressure of the gas via an air pressure gauge (not shown in the figures). Afterwards, the metrology tool 165 provides a determination on the topology (e.g., level) of the semiconductor wafer 2 or any portion thereof.

The metrology tool 165 may be electrically connected to the controller 70. The measurements from the metrology tool 165 are transmitted to the controller 70 for determining one or more process parameters for the exposure apparatus 50. It should be appreciated that the number of metrology tool 165 should not be limited to the embodiments shown in FIG. 1 and may vary based upon the number of regions to be measured on the semiconductor wafer 2 at the one time.

The load lock chamber 30 is located between the track apparatus 10 and the exposure apparatus 50. The load lock chamber 30 is arranged between the track apparatus 10 and the exposure apparatus 50. The load lock chamber 30 is configured for preserving the atmosphere within the exposure apparatus 50 by separating it from the track apparatus 10. The load lock chamber 30 is capable of creating an atmosphere compatible with the exposure apparatus 50 or the track apparatus 10 depending on where the loaded the semiconductor wafer 2 is scheduled to be next. This can be performed by altering the gas content of the load lock chamber 30 by such means as adding gas or creating a vacuum, along with other suitable means for adjusting the atmosphere in the load lock chamber 30. When the correct atmosphere has been reached, the semiconductor wafer 2 can be accessed by the transfer mechanism 13 or 56.

The exposure apparatus 50 is configured to use radiation or a high-brightness light to expose a photoresist layer coated on the semiconductor wafer 2. The exposure apparatus 50 may be generically referred to as a scanner that is operable to perform lithography exposing process with respective radiation source and exposure mode. In some embodiments, the exposure apparatus 50 includes a vacuum vessel 51, a wafer stage 52, an optical measurement tool 53, an exposure tool 54 and a transfer mechanism 56.

The vacuum vessel 51 preserves a vacuum environment at an ultra-high vacuum pressure. The wafer stage 52, the optical measurement tool 53 and the exposure tool 54 are positioned in the vacuum vessel 51. The wafer stage 52 is configured for supporting the semiconductor wafer 2. In some embodiments, the wafer stage 52 is positioned in the vacuum vessel 51 and moveable between a measuring position (indicated by solid lines) and an exposure position (indicated by dotted lines) by a driving member, such as linear motor (not shown in figures). A radial and rotational movement of the wafer stage 52 can be coordinated or combined in order to transfer, and deliver the semiconductor wafer 2.

The optical measurement tool 53 is configured for measuring the topographic height of the semiconductor wafer 2 and providing a determination on the topology (e.g., level) of the semiconductor wafer 2 or any portion thereof. The optical measurement tool 53 is positioned over the wafer stage 52 when the wafer stage 52 is positioned in the measuring position.

In some embodiments, the optical measurement tool 53 includes a transducer 531 and a collector 532. The transducer 531 is configured to emit a measuring signal (such as focused incident beam of radiation) to the surface of the semiconductor wafer 2. The collector 532 is configured to receive the measuring signal reflected from the semiconductor wafer 2. The optical measurement tool 53 may be electrically connected to the controlling apparatus 70 (FIG. 1). The measurements (such as topology of the semiconductor wafer) from the optical measurement tool 53 are transmitted to the controlling apparatus 70 for determining one or more process parameters for the exposure apparatus 50.

The exposure tool 54 is configured to apply a radiation beam that includes a pattern in the beam's cross-section onto the surface of the semiconductor wafer 2 so as to print the desired patterns over a photoresist layer coated on the semiconductor wafer 2. The exposure tool 54 is positioned over the wafer stage 52 when the wafer stage 52 is positioned in the exposure position. The technical features of the exposure tool 54, according to some embodiments, are described below.

Figure 2:
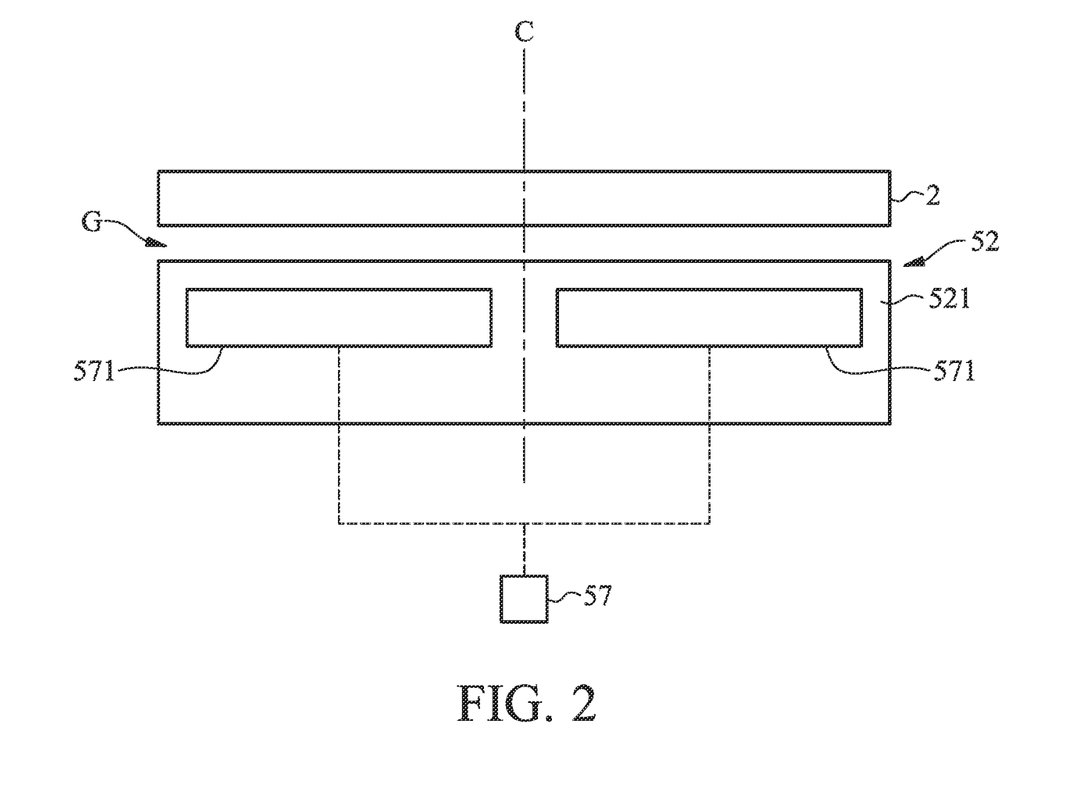
FIG. 2 shows a schematic cross-sectional view of a wafer stage in accordance with some embodiments.

FIG. 2 is a schematic cross-sectional view of a wafer stage 52 with a semiconductor wafer 2 positioned thereon, in accordance with some embodiments for securing a semiconductor wafer 2. The wafer stage 52 includes a dielectric body 521, a power supply 57 and a pair of electrodes 571. The electrodes 571 are embedded in a dielectric body 211. The dielectric body 211 defines an insulator for the electrodes 571 embedded therein.

In some embodiments, the electrodes 571 are coupled to the power supply 57 in a bipolar arrangement. In a monopolar arrangement, the power supply 57 applies a voltage to the electrode, e.g., 571, and causes electrostatic charges, e.g., negative charges. Electrostatic charges of the opposite polarity, e.g., positive charges, accumulate in the semiconductor wafer 2 on or near the back side by which the semiconductor wafer 2 is supported on the wafer stage 52. A gap, such as G, may exist due to one or more properties on the back side of the wafer supported on a chuck, such as warpage of the wafer or the presence of contaminants, etc.

A clamping force (also referred to as gripping force or pressure) is caused by the electrostatic attraction between the accumulated charges having opposite polarities. The clamping force holds or secures the semiconductor wafer 2 to the wafer stage 52. The clamping force depends on a variety of factors, including the size of the gap G, the thickness d of the dielectric body 521 between the electrodes 571 and the top surface of the wafer stage 52, and the voltage applied to the electrodes 571.

The configuration of the wafer stage 52 should not be limited to the embodiments above. Some exemplary embodiments of the wafer stage are described below.

Figure 3:
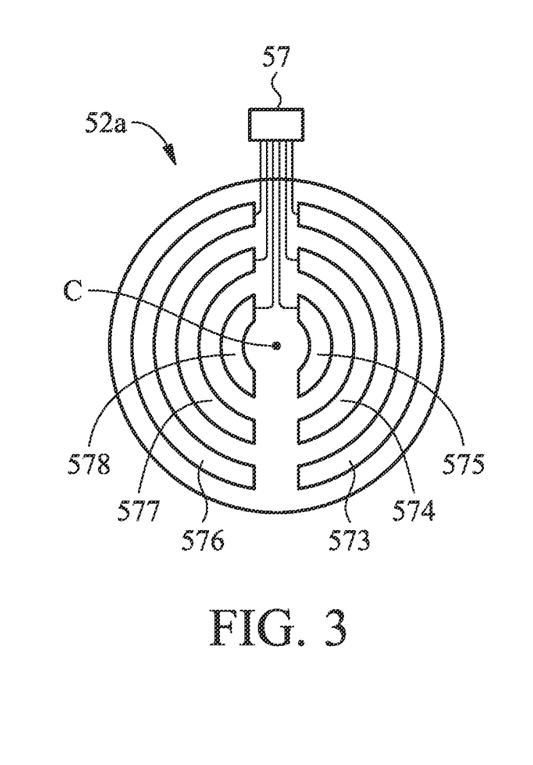
FIG. 3 shows a schematic top view of wafer stage, in accordance with some embodiments.

FIG. 3 shows a schematic top view of wafer stage 52a, in accordance with some embodiments. The wafer stage 52a includes a number of electrodes 573, 574, 575, 576, 577 and 578. The electrodes 573, 574, 575, 576, 577 and 578 are configured in an arc form in which each two electrodes constitute resemble a circle which surrounds the center of the wafer stage 52a. The electrodes 573, 574, 575, 576, 577 and 578 are electrically connected to a power supply 57 and controlled independently by the power supply 57.

In some embodiments, the clamping force in at least one of the electrodes 573, 574, 575, 576, 577 and 578 is controllable independent of the clamping force in at least another one of the electrodes. For example, at least the clamping force in the electrode 573 is controllable independent of the clamping force in the electrode 574. In some embodiments, the clamping force in each of the 573, 574, 575, 576, 577 and 578 is controllable independent of the clamping forces in the other electrodes 573, 574, 575, 576, 577 and 578. For another example, the electrodes 573, 574, 575, 576, 577 and 578 are all controllable independent of each other.

Figure 4:
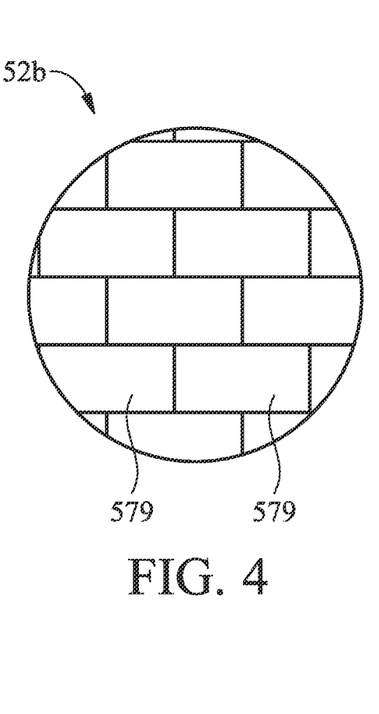
FIG. 4 shows a schematic top view of wafer stage, in accordance with some embodiments.
Figure 5:
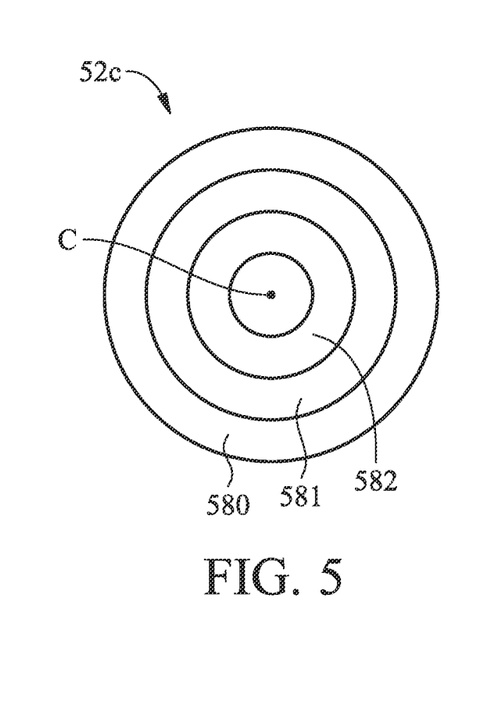
FIG. 5 shows a schematic top view of wafer stage, in accordance with some embodiments.

In some other embodiments, as shown in FIG. 4, electrodes 579 of a wafer stage 52b are configured in an array of tiles in which each electrode is one of the tiles in the array. In some other embodiments, as shown in FIG. 5, electrodes 580, 581 and 582 of a wafer stage 52c are configured in a ring form in which each of electrodes 580, 581 and 582 is one among a plurality of concentric rings and surrounds the center C of the wafer stage 52c Referring back to FIG. 1, the exposure tool 54 is configured to supply a high-brightness light to expose a photoresist layer coated on the semiconductor wafer 2. In some embodiments, the exposure tool 54 includes a high-brightness light source 541, an illuminator 542, a mask stage 543, a mask 544, and a projection optics module (or projection optics box (POB)) 545.

In some embodiments, the high-brightness light source 541 can be an EUV source which generates an EUV light with a wavelength centered at about 13.5 nm. However, it should be appreciated that the high-brightness light source 541 should not be limited to emitting EUV light. The high-brightness light source 541 may include a radiation source, such as an ultraviolet (UV) source or a deep ultraviolet (DUV) source.

In some embodiments, the illuminator 542 includes various refractive optic components, such as a single lens or a lens system having multiple lenses (zone plates) or alternatively reflective optics (for EUV lithography system), such as a single mirror or a mirror system having multiple mirrors in order to direct light from the high-brightness light source 541 onto the mask stage 543, particularly to a mask 544 secured to the mask stage 543. In the present embodiment where the high-brightness light source 541 generates light in the EUV wavelength range, reflective optics is employed.

The mask stage 543 is configured to secure the mask 544. In some embodiments, the mask stage 543 includes an electrostatic chuck (e-chuck) to secure the mask 544. In the present embodiment, the mask 544 is a reflective mask and includes a multiple reflective multiple layers (ML) deposited on a substrate so as to highly reflect the EUV light.

The projection optics module (or projection optics box (POB)) 545 is configured for imaging the pattern of the mask 544 on to the semiconductor wafer 2 secured to the wafer stage 52 of the exposure apparatus 50. In some embodiments, the POB 545 is a set of optical lenses. The optical lenses may include refractive optics (such as for a UV lithography system) or alternatively reflective optics (such as for an EUV lithography system) in various embodiments. The light directed from the mask 544, carrying the image of the pattern defined on the mask, is collected by the POB 545. The illuminator 542 and the POB 545 are collectively referred to as an optical module of the exposure apparatus 50.

In some embodiments, the exposure apparatus 50 further includes a number of actuators (not shown in the figures) connected to the illuminator 542 and the POB 545 to adjust the position of optic elements of the illuminator 542 and the POB 545. The actuators are electrically connected to the controlling apparatus 70. In addition, the actuator is controlled to drive the movement of the optic elements of the illuminator 542 and the POB 545 according the signals issued by the controlling apparatus 70. As a result, the focal length of the radiation scanned over the semiconductor wafer 2 can be adjusted.

In some embodiments, the controlling apparatus 70 includes an information handling system such as a computer, server, workstation, or another suitable device and is electrically connected to all elements of the lithographic system 1 to perform one or more steps of the methods and/or functions of the systems described herein.

For example, the controlling apparatus 70 is electrically connected to the metrology tool 165 and the optical measurement tool 53 and receives a signal in relation to the height of the semiconductor wafer 2 from the metrology tool 165 and the optical measurement tool 53. In addition, the controlling apparatus 70 is electrically connected to the wafer stage 52 of the exposure apparatus 50 so as to control the movement of the wafer stage 52, or alternatively to control the power supplied by the power supply 57.

Figure 6:
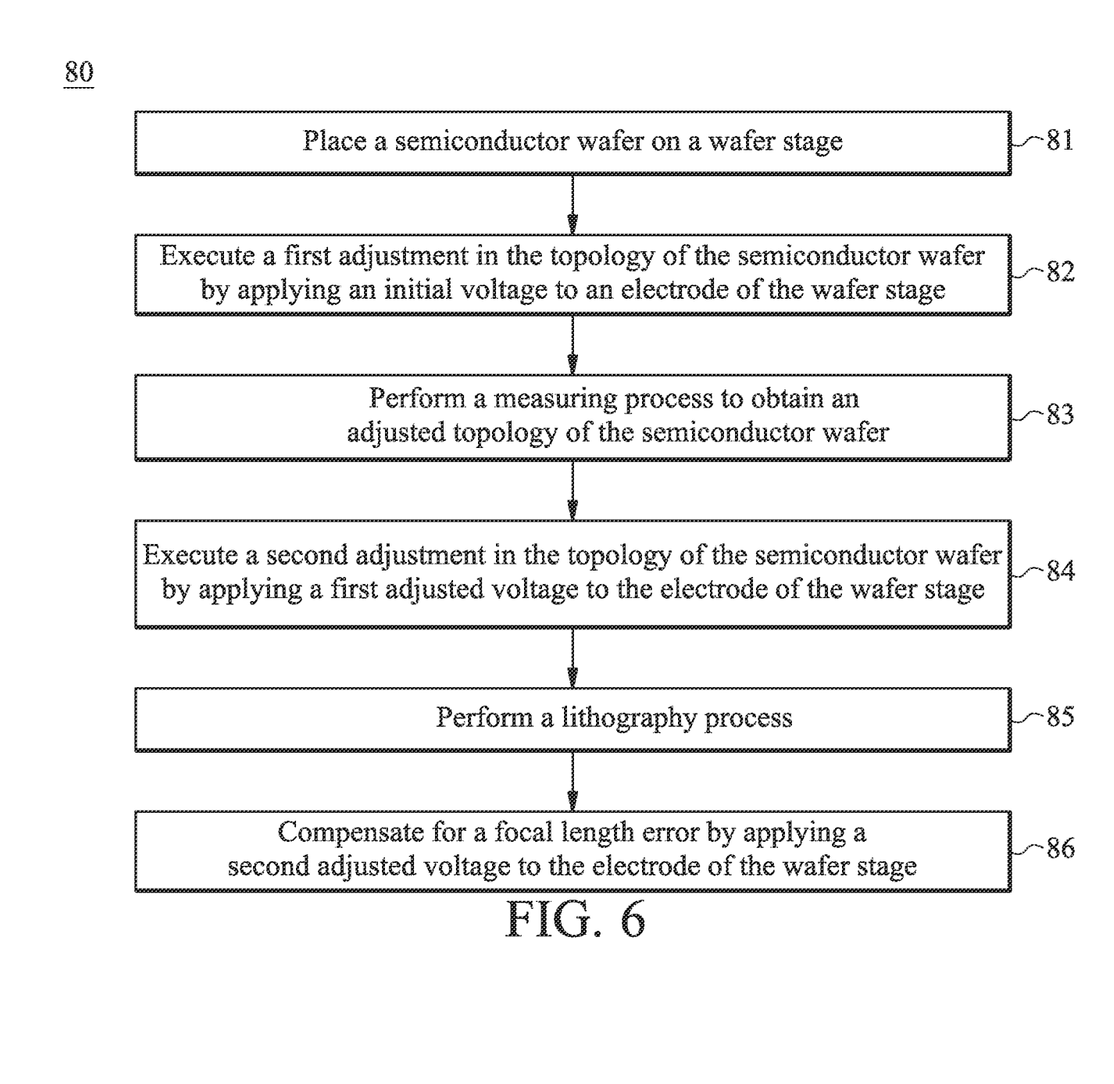
FIG. 6 shows a flow chart illustrating a method for performing a lithography exposing process, in accordance with some embodiments.

FIG. 6 is a flow chart illustrating a method 80 for performing lithography exposing process, in accordance with some embodiments. For illustration, the flow chart will be described in conjunction with the schematic views shown in FIGS. 1, 3 and 7-10. Some of the stages described can be replaced or eliminated for different embodiments.

The method 80 includes operation 81, in which the semiconductor wafer 2 is placed on a wafer stage, such as wafer stage 52a shown in FIG. 3, wafer stage 52b in FIG. 4, or wafer stage 52c in FIG. 5. For brevity, operations of the method 80 are described with reference to wafer stage 52a. In some embodiments, the semiconductor wafer 2 is transferred from the thermal chamber 16 to the wafer stage 52a via the load lock chamber 30. In some embodiments, before the semiconductor wafer 2 is sent to the load lock chamber 30, the semiconductor wafer 2 is coated with a photoresist layer (not shown in figures) in the coating chamber 14. Afterwards, the semiconductor wafer 2 is heated in the thermal chamber 16.

In some embodiments, temperatures in multiple regions of the semiconductor wafer 2 are measured in the thermal chamber 16, and the data associated with the temperature is sent to the controlling apparatus 70. In some other embodiments, flatness (or level) in multiple regions of the semiconductor wafer 2 are measured in the thermal chamber 16, and the data associated with the flatness is sent to the controlling apparatus 70. In some embodiments, there is no metrology process for measuring the height and/or temperature distributions of the semiconductor wafer 2.

The method 80 also includes operation 82, in which the electrodes 573, 574, 575, 576, 577 and 578 of the wafer stage 52a are controlled in an initial mode so as to execute a first adjustment (or a coarse adjustment) in the topology of the semiconductor wafer 2.

Figure 7:
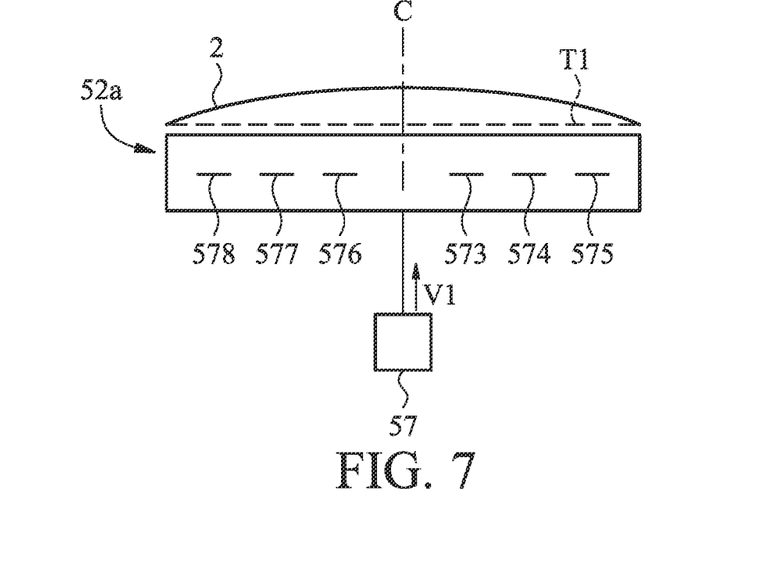
FIG. 7 shows a schematic view of one stage of a method for a lithography exposing process by applying an initial voltage to a wafer stage, in accordance with some embodiments.

In some embodiments, in the initial mode, the electrodes 573, 574, 575, 576, 577 and 578 are supplied with different initial voltages V1 from the power supply 57, and the initial voltages V1 supplied to the electrodes 573, 574, 575, 576, 577 and 578 are determined based on the topology of the semiconductor wafer 2. For example, as shown in FIG. 7, the central region of the semiconductor wafer 2 is higher than the edge region of the semiconductor wafer 2. To improve the flatness of the semiconductor wafer 2, the electrodes 573 and 576 are supplied with initial voltages V1 which are higher than initial voltages V1 applied to the electrodes 575 and 578. As a result, the central region of the semiconductor wafer 2 is attracted by a greater electrostatic force than the edge region of the semiconductor wafer 2 to allow the semiconductor wafer 2 to be substantially located at the target level T1 as shown in FIG. 7. The initial voltage V1 may be in a range from about 1.6 kV to about 3.2 kV.

Figure 8:
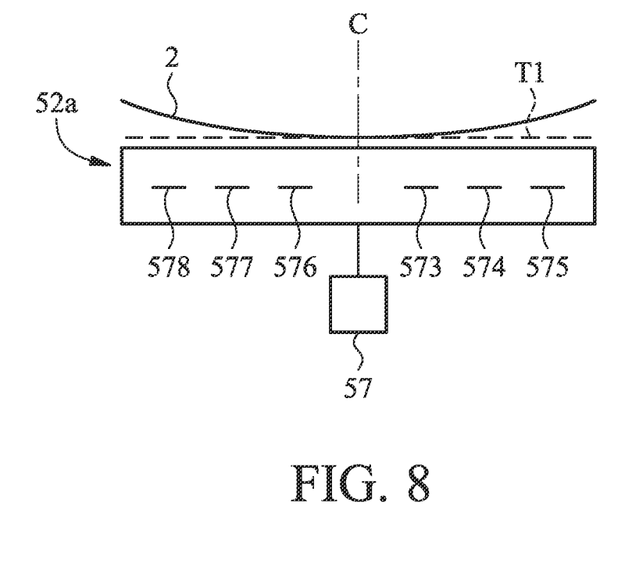
FIG. 8 shows a schematic view of one stage of a method for a lithography exposing process by applying an initial voltage to a wafer stage, in accordance with some embodiments.

In another example, as shown in FIG. 8, the central region of the semiconductor wafer 2 is lower than the edge region of the semiconductor wafer 2. To improve the flatness of the semiconductor wafer 2, the electrodes 575 and 578 are supplied with initial voltages V1 which are higher than initial voltages V1 applied to the electrodes 573 and 576. As a result, the edge region of the semiconductor wafer 2 is attracted by a greater electrostatic force than the central region of the semiconductor wafer 2 to allow the entire surface of the semiconductor wafer 2 to be substantially located at the target level T1 as shown in FIG. 8.

In some embodiments, the topology of the semiconductor wafer 2 is derived based on data associated with the height and/or temperature distributions of the semiconductor wafer 2 measured by the metrology tool 165 positioned in the thermal chamber 16. In some other embodiments, the topology of the semiconductor wafer 2 is derived based on historical data associated with warpage of the semiconductor wafer 2. The historical data may present an average flatness (or level) of multiple semiconductor wafers 2 which are processed under the same process in one or more previously conducted process runs. Alternatively, the historical data may present an average temperature distribution of multiple semiconductor wafers 2 which are processed under the same recipe in one or more process runs. The historical data may be recorded in a database and sent to the control unit 70 (FIG. 1) before the beginning of operation 82.

However, it should be appreciated that many variations and modifications can be made to embodiments of the disclosure. In some embodiments, in the initial mode, the electrodes 573, 574, 575, 576, 577 and 578 are supplied with the same initial voltage. The entire area of the semiconductor wafer 2 is evenly attracted by an electrostatic force generated by the electrodes 573, 574, 575, 576, 577 and 578 of the wafer stage 52a.

Figure 9:
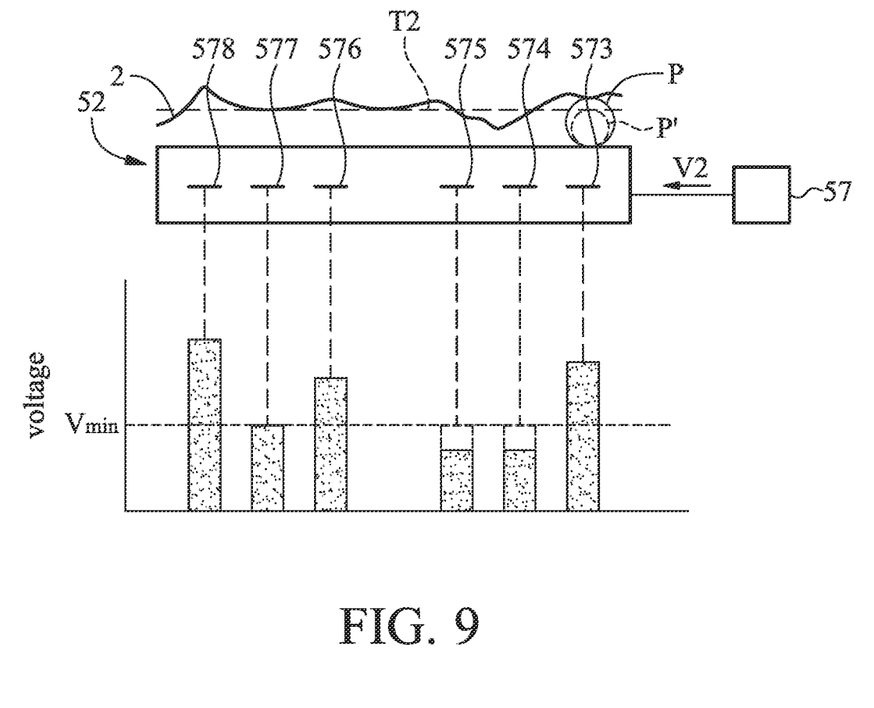
FIG. 9 shows a schematic view of one stage of a method for a lithography exposing process by applying different first adjusted voltages depicted as a bar diagram, in accordance with some embodiments.

With the completion of operation 82, the semiconductor wafer 2 held on the wafer stage 52 has an adjusted topology. As a result, the flatness of the semiconductor wafer 2 is sufficiently improved, and warpage due to non-uniform temperature distribution during the heating process in the thermal chamber 16 (FIG. 1) is solved. However, in one certain embodiment, as shown in FIG. 9, the semiconductor wafer 2, secured by the wafer stage 52, has not been adjusted to have a desired flatness for the process (e.g., EUV lithography process) that is to be conducted in the vacuum vessel 51. This uneven flatness may be a result of a presence of a particle P between the semiconductor wafer 2 and the wafer stage 52, a lower precision in the measurements of the height and/or temperature distributions of the semiconductor wafer 2, or other reasons. In order to improve the flatness of the semiconductor wafer 2, the following operations 83 and 84 are conducted.

In operation 83, a measuring process is conducted to obtain the adjusted topology of the semiconductor wafer 2 which is secured by the wafer stage 52 operated in the initial mode. In some embodiments, in the measuring process, the wafer stage 52 is moved to a measuring position as indicated by solid lines as shown in FIG. 1. Afterwards, as shown in FIG. 1, the transducer 531 emits a measuring signal (such as focused incident beam of radiation) to the surface of the semiconductor wafer 2. The incident beam is reflected off the surface of the semiconductor wafer 2 and is received by the collector 532. Afterwards, the optical measurement tool 53 determines the height of the wafer surface as a function of position from the incident and reflected beams of radiation. The measurements (such as topology of the semiconductor wafer) from the optical measurement tool 53 are transmitted to the controlling apparatus 70 for determining the adjusted topology (or level) of the semiconductor wafer 2.

In operation 84, the electrodes 573, 574, 575, 576, 577 and 578 of the wafer stage 52a are controlled in a first adjusted mode so as to execute a second adjustment (or fine adjustment) in the topology of the semiconductor wafer 2. In some embodiments, the electrodes 573, 574, 575, 576, 577 and 578 are supplied with different first adjusted voltages V2 from the power supply 57, and the first adjusted voltages V2 are determined based on the measurements in the adjusted topology of the semiconductor wafer 2 in operation 83. For example, as shown in FIG. 9, different regions of the semiconductor wafer 2 have different levels, and the electrodes 573, 574, 575, 576, 577 and 578 are supplied with electric voltage having different voltages that are proportional to the measured levels. As a result, the semiconductor wafer 2 is substantially located at the target level T2, as shown in FIG. 9. In some embodiments, the first adjusted voltage V2 is in a range from about 1.6 kV to about 3.2 kV.

However, it should be appreciated that many variations and modifications can be made to embodiments of the disclosure. In some embodiments, in the first adjusted mode, the electrodes 573, 574, 575, 576, 577 and 578 are supplied with the same first adjusted voltage. As a result, the entire area of the semiconductor wafer 2 is evenly attracted by an electrostatic force generated by the electrodes 573, 574, 575, 576, 577 and 578 of the wafer stage 52a.

In some embodiments, in operation 84, at least one electrode located below a region of the semiconductor wafer 2 which is lower than the target level T2, according to the measuring result in operation 83, is supplied with a minimum voltage $V_{min}$ rather than being proportionally adjusted according to the measurements in the adjusted topology. For example, as shown in FIG. 9, the regions corresponding to electrodes 574 and 575 is lower than the target level T2, and the electrodes 574 and 574 are supplied with an electric voltage (indicated by the bars illustrated with dotted lines) which is equal to the minimum voltage $V_{min}$. The minimum voltage $V_{min}$ may be equaled to the first adjusted voltage V2 that is applied to the electrode 577 that is located on the target level T2 Since all electrodes are supplied with an electric voltage higher than the minimum voltage $V_{min}$, the semiconductor wafer 2 can be securely hold by the wafer stage 52. The minimum first adjusted voltage $V_{min}$ may be about 1.6 kV.

In some embodiments, the back side of the semiconductor wafer 2 may be contaminated by a particle P. The particle P may result in an uneven surface of the semiconductor wafer 2. However, once the first adjusted voltage V2 is applied to the wafer stage 52a, the semiconductor wafer 2 is attracted to move toward the wafer stage 52a by the electrostatic force generated by the electrodes 573, 574, 575, 576, 577 and 578 of the wafer stage 52a. As a result, the particle P accumulated between the semiconductor wafer 2 and the wafer stage 52a is compressed to deform and is labeled as the particle P'. Therefore, an uneven surface of the semiconductor wafer 2 due to a particle contamination in the back side of the semiconductor wafer 2 is mitigated or avoided.

The method 80 also includes operation 85, in which a lithography exposing process is performed. In some embodiments, in the lithography exposing process, the wafer stage 52 is moved to an exposure position as indicated by dash lines shown in FIG. 1. Afterwards, the radiation beam, such as EUV light, with the calculated focal length is incident on the semiconductor wafer 2 to expose a pattern of a circuit feature or portion thereof in the exposure field (e.g., portion of semiconductor wafer exposed to radiation). Since the flatness of the semiconductor wafer 2 is adjusted in operation 84, an overlay error of the circuit feature in the lithography exposing process is reduced.

Figure 10:
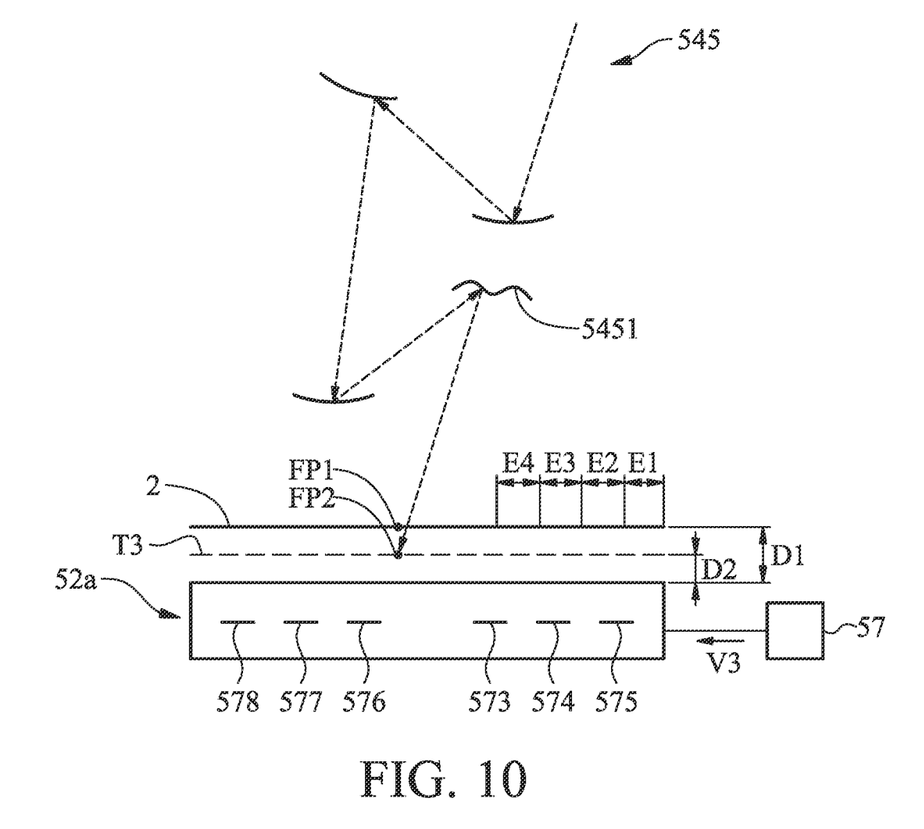
FIG. 10 shows a schematic view of one stage of a method for a lithography exposing process by applying a second adjusted voltage to a wafer stage, in accordance with some embodiments.

In some embodiments, as shown in FIG. 10, the semiconductor wafer 2 has a number of exposure fields, such as exposure fields E1, E2, E3 and E4. The exposure fields E1, E2, E3 and E4 may be located at any location of the semiconductor wafer 2. In some embodiments, during the lithography exposing process, the radiation beam from the exposure tool 54 sequentially expose the exposure fields E1, E2, E3 and E4 so as to expose a pattern in each of the exposure fields E1, E2, E3 and E4. The focal length of the radiation beam incident on the semiconductor wafer 2 is defined in part by the illuminator 542 and the POB 545.

In some embodiments, a focal length error occurs after the exposure of the first group of exposure fields E1 and E2 due to thermal stress applied to the illuminator 542 or the POB 545. For example, the focal point of the radiation beam may be shifted from an original focal point FP1 to a new focal point FP2 due to deformation of optical lens 5451 resulting from an increase of temperature after the exposure of the first group of exposure fields E1 and E2. If the remaining exposure fields, such as the second group of exposure fields E3 and E4, are exposed with out-of-focus radiation, the critical dimension of the features in the exposure fields E3 and E4 may not be accepted.

In order to properly expose the remaining exposure fields, such as the exposure fields E3 and E4, the method 80 also includes operation 86, in which the electrodes 573, 574, 575, 576, 577 and 578 are controlled in a second adjusted mode so as to compensate for a focal length error due to abnormality of the exposure tool 54 that may occur in the lithography exposing process.

In some embodiments, in the second adjusted mode, the semiconductor wafer 2 is secured to the wafer stage 52a (FIG. 7) by applying second adjusted voltages V3 to the electrodes 573, 574, 575, 576, 577 and 578 of the wafer stage 52a. After the electrodes 573, 574, 575, 576, 577 and 578 are supplied with the second adjusted voltages V3, the semiconductor wafer 2 is lower to align with the new focal point FP2.

In some embodiments, the second adjusted voltages V3 are determined based on historical data associated with a focal length error after exposure to the first group of exposure fields E1 and E2. The historical data associated with a focal length error may represent that the focal point of the radiation beam may be shifted from an original focal point FP1 to a new focal point FP2 after the exposure of the first group of exposure fields E1 and E2. The historical data may be recorded in a database and sent to the controlling apparatus 70 (FIG. 1) before the beginning of operation 86.

However, it should be appreciated that many variations and modifications can be made to embodiments of the disclosure. In some embodiments, in the second adjusted mode, the electrodes 573, 574, 575, 576, 577 and 578 are supplied with the same second adjusted voltage V3, such that the entire area of the semiconductor wafer is evenly attracted by an electrostatic force generated by the electrodes 573, 574, 575, 576, 577 and 578 of the wafer stage 52a.

By adjusting the clamp force during the lithography exposing process, each exposure fields E1, E2, E3 and E4 can be exposed with proper focal lengths. As a result, the overlay error can be controlled in an acceptable range regardless a deformation of optical lens, such as optical lens 545, resulting from high heat of radiation beam.

It should be appreciated that, while, in the above descriptions, the wafer stage 52a is utilized in the implementation of the method 80, it should be noted that the wafer stages shown in other embodiments can be used to realize the same method 80. In addition, while different voltages V1, V2 and V3 are applied to the wafer stage during three different operation modes (i.e., initial mode, first adjusted mode, and second adjusted mode), the wafer stage may be powered by the same voltage in two sequential operation modes. For example, the electric voltage applied to the wafer stage in the first adjusted mode is maintained at the initial voltage if the result of measuring process shows a height difference of the semiconductor wafer is in an acceptable range. In another example, the electric voltage applied to the wafer stage in the second adjust mode is maintained at the first adjusted voltage, if the offset of the focal point is in a range that can be modified by the illuminator 542 or the POB 545.

Embodiments of methods and apparatus allow an improvement in flatness of the semiconductor wafer by controlling the power supplied for the generation of a clamping force with a proper voltage. Since the photoresist layer on the semiconductor wafer can be exposed by suitable lithography parameter, an overlay error is reduced (overlay error is improved 0.3 nm according to an experimental data). Therefore, the product yield of the semiconductor wafer manufactured by the lithographic system is improved.

In accordance with some embodiments, a lithography apparatus is provided. The lithography apparatus includes a wafer stage configured to secure a semiconductor wafer and having a plurality of electrodes. The lithography apparatus further includes an exposure tool configured to perform an exposure process by projecting an extreme ultraviolet (EUV) light. The lithography apparatus also includes a power supply electrically connected to the electrodes of the wafer stage. In addition, the lithography apparatus includes a controller configured to control power from the power supply to the electrodes to have a first adjusted voltage during the exposure process for a first group of exposure fields on the semiconductor wafer so as to secure the semiconductor wafer to the wafer stage. The first adjusted voltage is in a range from about 1.6 kV to about 3.2 kV.

In some embodiments, the lithography apparatus further includes an optical measurement tool configured to perform a measuring process. The controller is further configured to determine the first adjusted voltage based on a topology produced in the measuring process.

In some embodiments, the lithography apparatus further includes a thermal chamber configured to heat the wafer before the radiation is projected onto the semiconductor wafer. The controller is further configured to control the power from the power supply to the electrodes to have an initial voltage before the exposure process. The initial voltage is different from the first adjusted voltage and is determined based on historical data associated with warpage caused by temperature differences in different regions of the semiconductor wafer after the heating of the semiconductor wafer in the thermal chamber.

In some embodiments, the lithography apparatus further includes a metrology tool positioned in the thermal chamber. The metrology tool is configured to measure a topographic height of the semiconductor wafer.

In some embodiments, the metrology tool measures the topographic height of the semiconductor wafer by discharging gas onto a surface of the semiconductor wafer and detecting a variation in the pressure of the gas.

In some embodiments, the controller is further configured to control the power from the power supply to the electrodes to have a second adjusted voltage during the exposure process for a second group of exposure fields on the semiconductor wafer. The second adjusted voltage is different from the first adjusted voltage and is determined based on a focal length of the exposure tool.

In some embodiments, the lithography apparatus further includes a cassette for containing a plurality of semiconductor wafers.

In accordance with some embodiments, a lithography system is provided. The lithography system includes an exposure apparatus, and the exposure apparatus includes: a wafer stage configured to secure a semiconductor wafer and having a plurality of electrodes; an optical measurement tool configured for measuring a topographic height of the semiconductor wafer; and an exposure tool configured to perform an exposure process to the semiconductor wafer. The wafer stage is movable between a measuring position below the optical measurement tool and an exposure position below the exposure tool. The lithography system also includes a controller configured to control power supplied to the electrodes. When the semiconductor wafer is located at the measuring position, an initial voltage is supplied to the electrodes. When the semiconductor wafer is located at the exposure position, a first adjusted voltage is supplied to the electrodes.

In some embodiments, the exposure apparatus further includes a vacuum vessel, and the wafer stage and the exposure tool are positioned in the vacuum vessel.

In some embodiments, the lithography system further includes a track apparatus electrically connected to the controller. The track apparatus includes a cassette station for containing a plurality of semiconductor wafers.

In some embodiments, the lithography system further includes a track apparatus electrically connected to the controller. The track apparatus further includes a processing station for processing the semiconductor wafer before the semiconductor wafer is located on the wafer stage.

In some embodiments, a metrology tool is positioned in the processing station. The metrology tool is configured to measure a topographic height of the semiconductor wafer.

In some embodiments, the metrology tool measures the topographic height of the semiconductor wafer by discharging gas onto a surface of the semiconductor wafer and detecting a variation in the pressure of the gas.

In some embodiments, the lithography system further includes a load lock chamber arranged between the track apparatus and the exposure apparatus. The load lock chamber is configured for preserving the atmosphere within the exposure apparatus by separating the exposure apparatus from the track apparatus.

In some embodiments, the first adjusted voltage is determined based on the topographic height of the semiconductor wafer measured by the optical measurement tool.

In accordance with some embodiments, a lithography apparatus is provided. The lithography apparatus includes a wafer stage configured to secure a semiconductor wafer and having a plurality of electrodes. The lithography apparatus also includes an exposure tool configured to perform an exposure process by projecting an extreme ultraviolet (EUV) light on the semiconductor wafer. The lithography apparatus further includes a controller configured to control power supplied to the electrodes to have a first adjusted voltage during the exposure process for a first group of exposure fields on the semiconductor wafer. The controller is further configured to control the power supplied to the electrodes to have a second adjusted voltage after supplying the first adjusted voltage during the exposure process for a second group of exposure fields on the semiconductor wafer.

In some embodiments, the second adjusted voltage is different from the first adjusted voltage and is determined based on a focal length of the exposure tool.

In some embodiments, the lithography apparatus further includes an optical measurement tool configured to perform a measuring process. The controller is further configured to determine the first adjusted voltage based on a topology produced in the measuring process.

In some embodiments, the lithography apparatus further includes a thermal chamber configured to heat the wafer before the EUV light is projected onto the semiconductor wafer. The controller is further configured to control the power from the power supply to the electrodes to have an initial voltage before the exposure process.

In some embodiments, the initial voltage is different from the first adjusted voltage and is determined based on historical data associated with warpage caused by temperature differences in different regions of the semiconductor wafer after the heating of the semiconductor wafer in the thermal chamber.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A lithography apparatus, comprising:
a wafer stage configured to secure a semiconductor wafer and having a plurality of electrodes;
an exposure tool configured to perform an exposure process by projecting an extreme ultraviolet (EUV) light on the semiconductor wafer; and
a controller configured to control power supplied to the electrodes to have a first adjusted voltage during the exposure process for a first group of exposure fields on the semiconductor wafer so as to secure the semiconductor wafer to the wafer stage, wherein the first adjusted voltage is in a range from about 1.6 kV to about 3.2 kV.

2. The lithography apparatus as claimed in claim 1, further comprising:
an optical measurement tool configured to perform a measuring process;
wherein the controller is further configured to determine the first adjusted voltage based on a topology produced in the measuring process.

3. The lithography apparatus as claimed in claim 1, further comprising a thermal chamber configured to heat the wafer before the radiation is projected onto the semiconductor wafer;
wherein the controller is further configured to control the power from the power supply to the electrodes to have an initial voltage before the exposure process;
wherein the initial voltage is different from the first adjusted voltage and is determined based on historical data associated with warpage caused by temperature differences in different regions of the semiconductor wafer after the heating of the semiconductor wafer in the thermal chamber.

4. The lithography apparatus as claimed in claim 3, further comprising a metrology tool positioned in the thermal chamber, wherein the metrology tool is configured to measure a topographic height of the semiconductor wafer.

5. The lithography apparatus as claimed in claim 4, wherein the metrology tool measures the topographic height of the semiconductor wafer by discharging gas onto a surface of the semiconductor wafer and detecting a variation in the pressure of the gas.

6. The lithography apparatus as claimed in claim 1, wherein the controller is further configured to control the power from the power supply to the electrodes to have a second adjusted voltage during the exposure process for a second group of exposure fields on the semiconductor wafer;
wherein the second adjusted voltage is different from the first adjusted voltage and is determined based on a focal length of the exposure tool.

7. The lithography apparatus as claimed in claim 1, further comprising a cassette for containing a plurality of semiconductor wafers.

8. A lithography system, comprising:
an exposure apparatus, comprising:
a wafer stage configured to secure a semiconductor wafer and having a plurality of electrodes;
an optical measurement tool configured for measuring a topographic height of the semiconductor wafer; and
an exposure tool configured to perform an exposure process to the semiconductor wafer, wherein the wafer stage is movable between a measuring position below the optical measurement tool and an exposure position below the exposure tool; and
a controller configured to control power supplied to the electrodes, wherein when the semiconductor wafer is located at the measuring position, an initial voltage is supplied to the electrodes,
wherein when the semiconductor wafer is located at the exposure position, a first adjusted voltage is supplied to the electrodes.

9. The lithography system as claimed in claim 8, wherein the exposure apparatus further comprises a vacuum vessel, and the wafer stage and the exposure tool are positioned in the vacuum vessel.

10. The lithography system as claimed in claim 8, further comprising a track apparatus electrically connected to the controller, wherein the track apparatus comprises a cassette station for containing a plurality of semiconductor wafers.

11. The lithography system as claimed in claim 8, further comprising a track apparatus electrically connected to the controller, wherein the track apparatus further comprises a processing station for processing the semiconductor wafer before the semiconductor wafer is located on the wafer stage.

12. The lithography system as claimed in claim 11, wherein a metrology tool is positioned in the processing station, wherein the metrology tool is configured to measure a topographic height of the semiconductor wafer.

13. The lithography system as claimed in claim 12, wherein the metrology tool measures the topographic height of the semiconductor wafer by discharging gas onto a surface of the semiconductor wafer and detecting a variation in the pressure of the gas.

14. The lithography system as claimed in claim 11, further comprising a load lock chamber arranged between the track apparatus and the exposure apparatus, wherein the load lock chamber is configured for preserving the atmosphere within the exposure apparatus by separating the exposure apparatus from the track apparatus.

15. The lithography system as claimed in claim 8, wherein the first adjusted voltage is determined based on the topographic height of the semiconductor wafer measured by the optical measurement tool.

16. A lithography apparatus, comprising:
a wafer stage configured to secure a semiconductor wafer and having a plurality of electrodes;

an exposure tool configured to perform an exposure process by projecting an extreme ultraviolet (EUV) light on the semiconductor wafer; and a controller configured to control power supplied to the electrodes to have a first adjusted voltage during the exposure process for a first group of exposure fields on the semiconductor wafer, where in the controller is further configured to control the power supplied to the electrodes to have a second adjusted voltage after supplying the first adjusted voltage during the exposure process for a second group of exposure fields on the semiconductor wafer.

17. The lithography apparatus as claimed in claim 16, wherein the second adjusted voltage is different from the first adjusted voltage and is determined based on a focal length of the exposure tool.

18. The lithography apparatus as claimed in claim 16, further comprising:

an optical measurement tool configured to perform a measuring process;

wherein the controller is further configured to determine the first adjusted voltage based on a topology produced in the measuring process.

19. The lithography apparatus as claimed in claim 16, further comprising a thermal chamber configured to heat the wafer before the EUV light is projected onto the semiconductor wafer, wherein the controller is further configured to control the power from the power supply to the electrodes to have an initial voltage before the exposure process.

20. The lithography apparatus as claimed in claim 19, wherein the initial voltage is different from the first adjusted voltage and is determined based on historical data associated with warpage caused by temperature differences in different regions of the semiconductor wafer after the heating of the semiconductor wafer in the thermal chamber.

* * * * *